(12) United States Patent
Castleman

(10) Patent No.: US 6,261,111 B1
(45) Date of Patent: Jul. 17, 2001

(54) TRUE RACK-AND-PANEL CONSTRUCTION WITH SELF-LOCKING CONNECTORS

(75) Inventor: Neal J. Castleman, Malibu, CA (US)

(73) Assignee: Ergo Mechanical Systems, Incorporated, Los Angeles, CA (US)

( * ) Notice: Subject to any disclaimer, the term of this patent is extended or adjusted under 35 U.S.C. 154(b) by 0 days.

(21) Appl. No.: 09/022,850

(22) Filed: Feb. 12, 1998

(51) Int. Cl.$^7$ .................................................. H01R 13/62
(52) U.S. Cl. ................................................................ 439/160
(58) Field of Search .................................... 439/160, 159, 439/372; 361/725, 727, 729, 730, 796, 797, 610; 307/119, 102, 106, 85, 150; 312/223.1, 223.2, 332.1, 311

(56) References Cited

U.S. PATENT DOCUMENTS

| | | | |
|---|---|---|---|
| 3,239,795 | * 3/1966 | Verrone | 439/121 |
| 3,259,872 | * 7/1966 | Kyle | 439/362 |
| 4,329,005 | 5/1982 | Braginetz et al. | 439/51 |
| 4,344,663 | * 8/1982 | Ognier et al. | 439/362 |
| 5,103,378 | 4/1992 | Stowers et al. | 361/415 |
| 5,173,845 | * 12/1992 | Shaw | 361/415 |
| 5,388,995 | * 2/1995 | Rudy, Jr. et al. | 439/61 |
| 5,409,394 | 4/1995 | Astier | 439/347 |
| 5,557,499 | * 9/1996 | Reiter et al. | 361/685 |

* cited by examiner

Primary Examiner—Brian Sircus
Assistant Examiner—Javaid Nasri
(74) Attorney, Agent, or Firm—Ashen & Lippman

(57) ABSTRACT

Method as well as apparatus makes and breaks electrical connections between at least one electrical cable connector and an electronics module that has at least one corresponding panel connector. A rack receives and holds the module. A cable-connector holder, formed in the rack, receives and holds the cable connector(s) in positions aligned with the panel connector(s) when the electronics module is held in the rack. Each cable-connector holder easily and quickly engages, or disengages from, a corresponding cable connector. The rack itself provides only a mechanical intermediary, not an electrical intermediary, between the panel connectors and cable connectors. Preferably there are numerous cable connectors, with corresponding cable-connector holders and panel connectors. In this case the rack includes a device for quickly and easily disengaging the electronics module from the rack, and all the cable connectors from panel connectors, essentially simultaneously. The device preferably includes a door on the rack, and a system of lever arms with a rod for pulling the module out of the rack slightly. Analogous devices on the inside of the door help push the module into the rack, after it has been almost completely inserted, to finish seating the connectors. Preferably slots formed in the rack receive sliding hooks associated with each cable connector, and tapered centering pins help align the cable connectors to the module panel connectors.

5 Claims, 19 Drawing Sheets

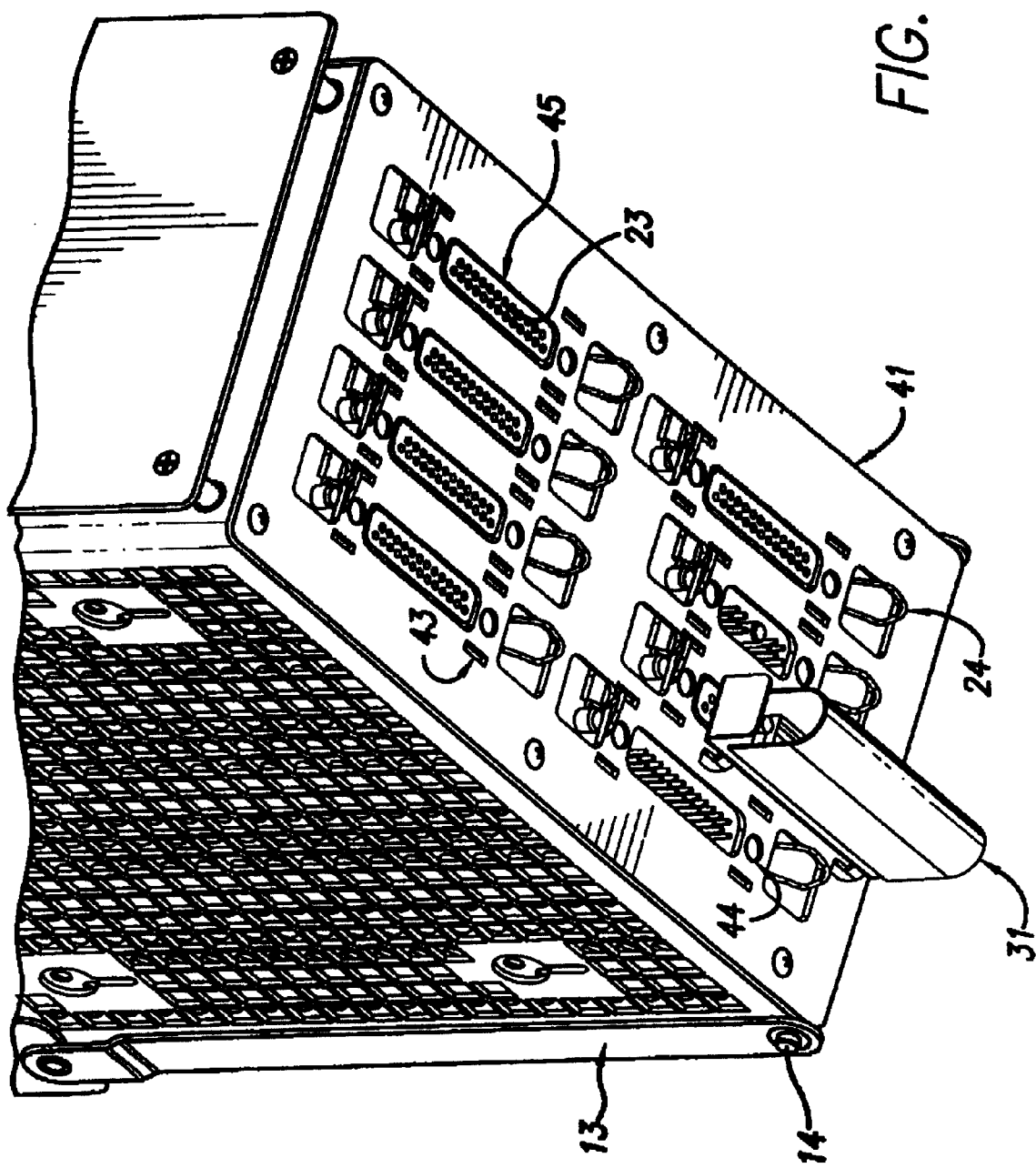

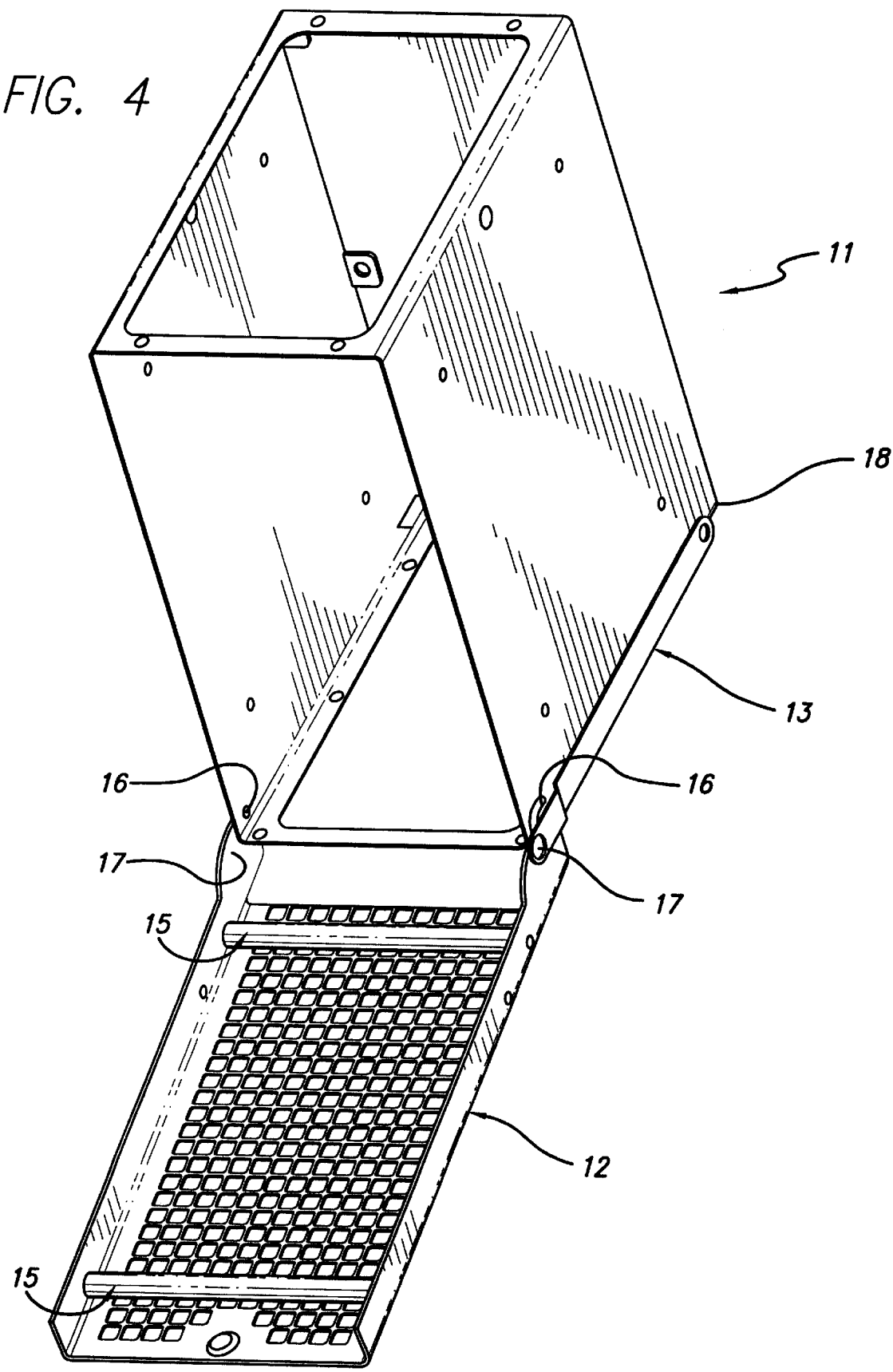

```
┌─────────────────────────────────────────────┐
│ INSERT THE ELECTRONICS MODULE INTO THE RACK │
└─────────────────────────────────────────────┘
                      │
                      ▼
┌───────────────────────────────────────────────────┐
│ OPERATE LEVER TO SEAT ALL CABLE CONNECTORS SIMULTANEOUSLY │
└───────────────────────────────────────────────────┘
```

FIG. 6

```
┌───────────────────────────────────────────────┐
│ OPERATE LEVER TO START ALL OF THE CABLE CONNECTORS │
│      OUT OF CORRESPONDING PANEL CONNECTORS    │
└───────────────────────────────────────────────┘
                      │
                      ▼
┌───────────────────────────────────────────────┐
│   THEN REMOVE THE ELECTRONICS MODULE FROM THE RACK   │
└───────────────────────────────────────────────┘
```

FIG. 7

```
┌─────────────────────────────────────────────────────┐
│ PLUG THE INDIVIDUAL CABLE CONNECTOR INTO ITS RESPECTIVE │
│   INDIVIDUAL PANEL CONNECTOR OF THE ELECTRONICS MODULE  │
└─────────────────────────────────────────────────────┘
                      │
                      ▼
┌─────────────────────────────────────────────────────┐
│ SECURE THE INDIVIDUAL CABLE CONNECTOR TO ITS RESPECTIVE │
│   INDIVIDUAL CABLE-CONNECTOR HOLDER ON THE RACK         │
└─────────────────────────────────────────────────────┘
```

FIG. 8

PLUG THE INDIVIDUAL CABLE CONNECTOR INTO ITS RESPECTIVE INDIVIDUAL PANEL CONNECTOR OF THE ELECTRONICS MODULE

↓

SECURE THE INDIVIDUAL CABLE CONNECTOR TO ITS RESPECTIVE INDIVIDUAL CABLE-CONNECTOR HOLDER ON THE RACK BY ADVANCING THE CONNECTOR GENERALLY STRAIGHT INTO THE HOLDER TO OPERATE THE CAM FOR TEMPORARY DISPLACEMENT OF THE SLIDE-LOCK AND ENABLE ENGAGEMENT OF THE CONNECTOR WITH THE HOLDER

*FIG. 8A*

DISCONNECT THE INDIVIDUAL CABLE CONNECTOR FROM ITS RESPECTIVE INDIVIDUAL CABLE-CONNECTOR HOLDER

↓

UNPLUG THE INDIVIDUAL CABLE CONNECTOR FROM ITS RESPECTIVE INDIVIDUAL PANEL CONNECTOR OF THE ELECTRONIC MODULE

*FIG. 9*

DISCONNECT THE INDIVIDUAL CABLE CONNECTOR FORM ITS RESPECTIVE INDIVIDUAL CABLE-CONNECTOR HOLDER

↓

UNPLUG THE INDIVIDUAL CABLE CONNECTOR FORM ITS RESPECTIVE INDIVIDUAL PANEL CONNECTOR OF THE ELECTRONICS MODULE BY OPERATING A SLIDE-LATCH ON THE CABLE CONNECTOR TO RELEASE THE CONNECTOR FROM THE HOLDER

*FIG. 9A*

TRUE RACK-AND-PANEL CONSTRUCTION WITH SELF-LOCKING CONNECTORS

RELATED PATENT DOCUMENTS

A closely related document is U.S. Pat. No. 5,409,394 of Astier.

FIELD OF THE INVENTION

This invention relates generally to equipment and procedures for making wiring connections, and more particularly to equipment and procedures for quickly and easily making and breaking a large number of cable connections to an electronics module simultaneously, or any of such connections selectively. The invention is also applicable to facilitating the making or breaking of multiple-conductor connections if all the wiring passes through only a few cable connectors, or even just one.

BACKGROUND OF THE INVENTION

A common apparatus used by the airline industry is an electronics module. Each electronics module is connected to other equipment by cables. An electronics module utilizes a common device, to make and break these cable connections, called a cable connector.

One category of electronics module contains equipment which operates a variety of functions in an aircraft passenger cabin. There is typically one electronics module for each row of passenger seats on an airliner. In a commercial airliner an electronics module is commonly mounted under a seat, and therefore is inconvenient or awkward to reach.

During flight, aircraft undergo a significant amount of vibration. Therefore, the electronics modules should be securely fastened to the aircraft and the cable connectors should be securely fastened to the electronics module. The electronics modules and the cable connectors, however, also require testing, repair and replacement, and therefore must be removable. For these purposes different designs are now in use as will be explained shortly.

First, however, it should be noted that such removal of electronics modules is quite frequent. It must also be recognized that in the airline industry profit is made only by flying, and enormous loss or expense is incurred whenever aircraft must remain on the ground because of testing and repair.

Of course many spare modules can be kept available, so that a jetliner need not be delayed for the entire duration of testing and repair of a malfunctioning electronics module. Nevertheless the sensitivity of airline operations to idle time is so great that even a few minutes' delay for removal or replacement—or for the availability of a highly trained technician to perform such procedures—represents monumental cost.

(a) Nonrack

In the nonrack design (FIGS. 10 and 11) the electronics module 51 is mounted on a plate 52 with some means for attaching and detaching the plate from the aircraft. Numerous panel connectors 53 are permanently fixed in the electronics module, and the cable connectors are attached directly to the electronics-module panel connectors.

Therefore to test, repair or replace the electronics module each cable connector must be individually disconnected from its corresponding panel connector on the electronics module. Each cable connector is securely fastened to the electronics module by a respective latch 55 fixed permanently at each end of the panel connector.

When a cable connection is made, the two latches are manually fastened to each cable connector. To ensure that each cable connector will not disconnect due to vibration, the latches are made very difficult to engage or remove. Thus it is awkward and time consuming to remove the electronics module because all of the individual cable connections must be painstakingly disconnected first.

After the above steps are taken the electronics module can be disconnected from the aircraft. This is done by lifting four different knobs 54 on the electronics-module mounting plate to disconnect it from the aircraft.

In order to replace the electronics module the plate has to be reattached to the aircraft by pushing down the knobs. Then each individual cable connector must be reattached—first engaging the cable connector with the panel connector on the electronics module, and next fastening the two latches to the cable connector.

To properly engage the cable connector with the panel connector it might be helpful for a person to visually align them. This would necessitate lying on the floor of the aircraft because the electronics modules are under the seats. It is very important that the connectors be properly aligned with each other so that they will engage correctly, otherwise they could sustain significant damage or fail to create a wiring connection.

This nonrack apparatus creates a process that is very time consuming and requires a great deal of effort. Nonrack systems have somewhat passed out of modern use.

(b) Rack

This design includes an electronics module, cable connectors, and a rack 64 (FIGS. 13 through 13c) with a unitary connector 61 bolted 63 to it. The electronics module is not attached to the cable connectors directly. The electronics module slides into, and is locked within, a rack that is securely attached to the aircraft.

Therefore an intermediary between the cables and the electronics module has been created. This intermediary is both mechanical and electrical. The rack is a mechanical intermediary, and the unitary cable connector is an electrical intermediary.

This connector has one end of the cables permanently attached to it, with the opposite end extending toward—or in some cases to—other equipment. At the opposite ends of the cables 62 are cable connectors for attachment to such other equipment.

This design fixes cables to the rack instead of using removable individual cable connectors attached directly to the electronics module. The connector is positioned in the rack such that it is properly aligned to make the connection with the panel connector on the electronics module.

This design allows the electronics module to be removed from the rack without having to disconnect any of the cable connectors. To remove the electronics module from the rack, a hold-down device is manually unscrewed to release the electronics module from the rack and forcibly withdraw the multiple connector pins. Then the electronics module is pulled out by a handle on the module itself.

To put the electronics module back in place, it first must be slid into the rack. Once in the rack, the electronics module is manually pushed into place to engage the connector. Then the electronics module is secured by the hold-down device, which requires a person to manually screw the device in—to forcibly engage the multiple pins, and until the electronics module is secure.

Although the electronics module can be removed without individually removing each cable connector as in the previous design, the unitary connector is permanently attached to the rack. Therefore the entire rack must be removed to test, repair, or replace the connector. This requires a significant amount of time and effort.

(c) Cable connector

The Astier patent mentioned earlier covers a slide locking device 120 for connectors 105 (FIGS. 12 through 12B). This locking element fixes a cable connector to a panel connector 140. The locking element is partially attached to the cable connector (FIG. 12A), and positioned between the cable connector and the panel connector (FIG. 12B).

The locking element has several hooks 130 which engage corresponding slots 143 on a panel 142 after the connection has been made between the connectors. Then the locking element is manually slid laterally to engage the hooks with the panel. This device allows the individual cable connectors to be attached to the panel, and does so without the cumbersome latches described above. In order to make a proper connection, however, a person should visually align the connectors, engage the connectors, and then slide the locking mechanism to engage the lock.

This locking device would make it slightly faster to disconnect all of the cable connectors from the electronics module in the nonrack design discussed above. The process, however, is still overly time consuming. This is mainly because the cable connectors must be individually disconnected from the electronics module in order to remove the electronics module. This locking device would not apply to the bolted-on connector of the rack design.

(d) Conclusion

From the preceding descriptions, it is apparent that the devices currently being used have significant disadvantages. Thus important aspects of the technology used in the field of the invention remain amenable to useful refinement.

SUMMARY OF THE DISCLOSURE

The present invention introduces such refinement. In its preferred embodiments, the present invention has several aspects or facets that can be used independently, although they are preferably employed together to optimize their benefits.

In preferred embodiments of a first of its facets or aspects, the invention is an apparatus for making or breaking electrical connections between at least one electrical cable connector and an electronics module that has at least one corresponding panel connector. The apparatus includes a rack for receiving and holding the electronics module.

It also includes at least one cable-connector holder, formed in the rack. The holder is for receiving and holding the at least one cable connector—in position aligned with the at least one panel connector, when the electronics module is held in the rack. The at least one cable-connector holder has some means for easily and quickly engaging or disengaging the corresponding cable connector.

For purposes of the greatest breadth and generality in describing and discussing my invention, I shall call these means the "connector engaging or disengaging means" or in some cases simply the "engaging or disengaging means". As will be seen, these means may take any of a great number of variant or equivalent forms.

The foregoing may constitute a description or definition of the first facet of the invention in its broadest or most general form. Even in this general form, however, it can be seen that this aspect of the invention significantly mitigates the difficulties left unresolved in the art.

In particular, this aspect or facet of the invention creates an exclusively mechanical intermediary (the rack) between the cable connector and the electronics module. This intermediary maximizes efficiency by substantially reducing the amount of time and effort needed to engage or disengage the electronics module from the at least one cable connector—but without the associated heavy and expensive electrical intermediary found in the prior art. This benefit arises because the cable connector can be securely attached to the rack, not the electronics module.

Therefore, the at least one cable connector need not be manually disengaged from or engaged with the respective panel connector or connectors on the electronics module, to remove or replace the electronics module. This invention allows for the immediate making or breaking of the connection between the cable connector and the panel connector—while maintaining the engagement of the cable connector to the cable-connector holder on the rack.

Further, the cable-connector holder—by also providing quick and easy engagement or disengagement of the cable connector(s) from the rack—achieves in one economical and lightweight system the best of all prior-art alternatives. Thus either the electronics module or the cable connector, independently, will be quickly and easily removable or replaceable.

Although this aspect of the invention in its broad form thus represents a significant advance in the art, it is preferably practiced in conjunction with certain other features or characteristics that further enhance enjoyment of overall benefits.

For example, it is preferred that the at least one cable-connector holder comprise an array of numerous individual cable-connector holders formed in the rack. These cable-connector holders are for receiving and holding the numerous individual cable connectors—in positions respectively aligned with the numerous individual panel connectors, when the electronics module is held in the rack. By virtue of this alignment it will be possible to make or break all the numerous cable-to-panel connections simultaneously, merely by pushing the module into or pulling it out of the rack—and this, once again, without the expensive, heavy electrical intermediary of the prior art.

In addition it is preferred that the engaging or disengaging means include an aperture in the rack. It is also preferred that the aperture in the rack be a narrow elongated slot. Various equivalents may be substituted, as will be shown in a later section of this document.

Another preference is that the invention include some means for guiding the cable connector into the cable-connector holder. Again for generality and breadth of discussion I shall refer to these means simply as the "guiding means".

Also preferred is that the guiding means include two apertures in the cable-connector holder for receiving two tapered screws on the cable connector. It is also preferred that the two apertures be substantially circular. Other equivalent forms of guiding means, however, are discussed in a later section.

Further preferred is that the rack have some means for quickly and easily disengaging the electronics module from the rack. Once again for generality I shall refer to these means as the "disengaging means".

When there are plural cable connectors, these means preferably also disconnect the cable connectors from all the panel connectors substantially simultaneously. I further prefer that the disengaging means include two lever arms and a rod connected to those arms to slightly pull the electronics module out of the rack.

It is still further preferred that the rack have some means for quickly and easily engaging the electronics module with the rack. These engaging means should also seat all the cable connectors to the corresponding panel connectors substantially simultaneously. Again for breadth I shall refer to these means as the "electronics-module engaging means" or in some cases simply "engaging means".

The engaging means preferably also include at least one bar on the inside of the door of the rack. A variety of equivalents is possible, and is discussed in a later section of this document.

In preferred embodiments of a second of its independent facets or aspects, the invention is an apparatus for making or breaking electrical connections between at least one electrical cable and an electronics module. The module has at least one panel connector.

The apparatus includes a rack for receiving and holding the electronics module. It also includes at least one cable-connector terminating the cables, respectively.

The apparatus further includes at least one cable-connector holder, formed in the rack, for receiving and holding the at least one cable connector. The at least one cable connector will be held in position aligned with the at least one panel connector, when the electronics module is held in the rack.

Each cable connector has some means for easily and quickly engaging, or disengaging from, a corresponding cable-connector holder. These means, for reasons suggested earlier, I shall call the "connector-holder engaging or disengaging means" or in some occurrences simply the "engaging and disengaging means". Further, each cable connector preferably includes pins for mating directly with a corresponding panel connector of the electronics module.

The foregoing may constitute a description or definition of the second facet of the invention in its broadest or most general form. Even in this general form, however, it can be seen that this aspect of the invention too significantly mitigate the difficulties left unresolved in the art.

In particular, such an invention minimizes the time, effort and skill required to make and break connections between the cable connector or connectors and the cableconnector holder or holders on the rack, because each cable connector of my invention can easily and quickly engage or disengage its cable-connector holder. This feature enables swift and ready direct access to the cable wires for troubleshooting or cable-connector rewiring, a capability lacking in the previously discussed prior-art rack system.

Yet the rapid and convenient installation and withdrawal of each electrical module in prior rack systems is preserved, because each cable-connector holder in the rack aligns with a respective panel connector on the electronics module. Therefore when the cable connector is attached to the rack, the cable connector is precisely aligned with its corresponding panel connector on the module.

This second aspect of the invention in its broad form thus represents a significant advance in the art. Nevertheless it is preferably practiced in conjunction with certain other features or characteristics that further enhance enjoyment of overall benefits.

For example, the invention has even more salient advantages if used with a host electrical system in which the "at least one" electrical cable actually includes numerous individual cables, and in which the electronics module has correspondingly numerous individual panel connectors, in an array. In this case it is preferred that the at least one cable connector include numerous individual cable connectors terminating the cables, respectively.

In the multicable case it is also desirable that the "at least one" cable-connector holder include an array of individual cable-connector holders, formed in the rack. This array of holders is for receiving and holding the numerous individual cable connectors in positions aligned with the numerous individual cable connectors, respectively, when the electronics module is held in the rack.

It is also preferred that there be some means for engaging or disengaging each cable connector. These means include a respective slide-lock retainer that tends to prevent vibration-induced spontaneous disconnection of the individual cable connector from its connector holder.

It is also preferred that the slide-lock retainer have a self-locking mechanism to automatically secure the retainer to the corresponding connector holder. Preferably the self-locking mechanism includes a spring-loaded latch.

It further preferably includes a cam that engages the corresponding connector holder during making of a connection. The cam moves the latch out of its locked position temporarily permitting connection of the individual cable connector to its holder.

It is also preferred that the second independent aspect of the invention include numerous individual panel connectors of the electronics module. Preferably the panel connectors are mounted in a common chassis panel of the electronics module.

It is additionally preferred that the second independent aspect of the invention further include the electronics module. I am going to pause to point out the powerful and important invention described by the preference just introduced. When the rack is combined with the cable connectors and the electronics module, a very efficient apparatus is created.

The rack has a front panel with an array of cable-connector holders which have some means for quickly and easily engaging or disengaging the cable connectors. The cable connectors also have the corresponding means to quickly and easily engage or disengage the cable-connector holders.

Therefore the cables can be quickly and easily connected or disconnected from the rack for testing or replacement. Further, the electronics module can be removed from the rack without having to disconnect any of the cable connectors.

To fully appreciate the beneficial qualities of the invention described above it must be viewed in the environment in which it will be used. As explained in a preceding section, the invention can be used in aircraft—most commonly one complete apparatus for each row of seats on an airliner—and even a few minutes of idle time for changing out an electronics module represents astonishingly high and unacceptable expense or lost profit.

The electronics-module portion of this preferable form of my invention can be removed from the rack or replaced with minimal skill, effort and time—thus obviating the need to incur such undesired effects. In view of the large number of electronics modules in each aircraft, it can be appreciated how important and valuable this invention is.

In preferred embodiments of a third of its independent aspects or facets, the invention is a cable connector for positioning a cable at a connector holder. It includes a multiplicity of connector pins mounted in a connector body, and some means for connecting wires to the pins. It also includes a slide-lock retainer for engaging the connector holder, which avoids vibration-induced spontaneous disconnection of the connector from its holder. Also included is a self-locking mechanism to automatically secure the retainer to the corresponding connector holder.

The foregoing may constitute a description or definition of the third facet of the invention in its broadest or most general form. Even in this general form, however, it can be seen that this aspect of the invention too significantly mitigates the difficulties left unresolved in the art.

In particular, due to the locations of electronics modules in aircraft, it is difficult to maneuver arms, hands and tools when engaging or disengaging the cable connectors. Through use of a self-locking mechanism the cable connectors can be attached to the cable-connector holders on the rack by simply aligning and pushing.

This cable connector allows a cable to be engaged or disengaged with the use of only one hand, and without tools. In light of the fact that these connections are made under an airplane seat or the like, it is important that the connection can be made with utmost ease. My self-locking mechanism provides that ease.

Although this third aspect of the invention in its broad form thus represents a significant advance in the art, it is preferably practiced in conjunction with certain other features or characteristics that further enhance enjoyment of overall benefits.

For example, it is preferred that the self-locking mechanism include a spring-loaded latch and a cam that engages the corresponding connector holder during making of a connection. The cam moves the latch out of its locked position temporarily, permitting connection of the individual cable connector to its holder.

It is also preferred that this aspect of the invention include a tapered element projecting from the cable connector toward a receptacle in the holder. This tapered element facilitates manual alignment of the connector and its corresponding holder.

In preferred embodiments of a fourth of its independent facets or aspects, the invention is a method of interconnecting numerous cable connectors with corresponding numerous panel connectors of an electronics module. This is done using a rack that receives the module at one side of the rack and receives the panel connectors at another side of the rack.

This method includes at least two steps. A first is insertion of the electronics module into the rack. A subsequent step is operation of a lever to seat all the cable connectors and corresponding panel connectors substantially simultaneously.

The foregoing may constitute a description or definition of the fourth facet of the invention in its broadest or most general form. Even in this general form, however, it can be seen that this aspect of the invention too significantly mitigate the difficulties left unresolved in the art.

In particular, this method ensures proper alignment of the cable connectors and the corresponding panel connectors. When the lever is operated it seats the connectors together with precision. This apparatus ensures that the connections are correctly made.

In preferred embodiments of a fifth of its independent facets or aspects, the invention is a method of disconnecting numerous cable connectors from corresponding numerous panel connectors of an electronics module. This is done using a rack that receives the module at one side of the rack and receives the panel connectors at another side of the rack.

This method includes at least two steps. A first is operation of a lever to start all the cable connectors out of the corresponding panel connectors substantially simultaneously. Another is removal of the electronics module from the rack.

The foregoing may constitute a description or definition of the fifth facet of the invention in its broadest or most general form. Even in this general form, however, it can be seen that this aspect of the invention too significantly mitigates the difficulties left unresolved in the art.

In particular, this method allows for the removal of the electronics module from the rack with minimal time, skill and effort. The cable connections are disengaged without damage, since the extraction path is reproducibly straight and parallel to the connector pins, for minimal stress.

In preferred embodiments of a sixth of its independent facets or aspects, the invention is a method of connecting an individual cable connector which is one of numerous cable connectors attached to respective numerous individual panel connectors of an electronics module. This is done using a rack that receives the module at one side of the rack and receives the panel connectors at another side of the rack.

This method includes at least two steps. First the individual cable connector is plugged into its respective individual panel connector of the electronics module. Then the individual cable connector is secured to its respective individual cable-connector holder.

The foregoing may constitute a description or definition of the sixth aspect of the invention in its broadest or most general form. Even in this general form, however, it can be seen that this facet of the invention too significantly mitigates the difficulties left unresolved in the art. In particular, this method allows the electronics module to be removed without having to unplug all of the individual cable connectors.

Although this sixth aspect of the invention in its broad form thus represents a significant advance in the art, it is preferably practiced in conjunction with certain other features or characteristics that further enhance enjoyment of overall benefits.

For example, it is preferred that the method be used with a cable connector that has a slide-lock device with a cam. The cam engages the connector holder to temporarily displace the slide-lock device for attachment to the connector holder. Preferably then the securing step includes advancing the connector generally straight into the holder to operate the cam for temporary displacement of the slidelock. This step enables engagement of the connector with the holder.

In preferred embodiments of a seventh of its independent facets or aspects, the invention is a method of disconnecting an individual cable connector which is one of numerous cable connectors attached to respective numerous individual panel connectors of an electronics module. This is done by using a rack that receives the module at one side of the rack and receives the panel connectors in respective individual cable-connector holders at another side of the rack.

This method has at least two steps. They include first disconnecting the individual cable connector from its respective individual cable connector holder, and then unplugging the individual cable connector from its respective individual panel connector of the electronics module.

The foregoing may constitute a description or definition of the seventh facet of the invention in its broadest or most general form. Even in this general form, however, it can be seen that this aspect of the invention too significantly mitigates difficulties left unresolved in the art. Specifically, while maintaining the benefits of easy module installation and removal the invention achieves very rapid and easy removal of cable connectors individually for voltage, continuity, or functional checks of the connected wiring or remote circuitry—or both.

Although this aspect of the invention even as thus broadly couched serves an excellent purpose, nevertheless preferably it is performed with certain additional features or characteristics that further enhance enjoyment of overall benefits. For example, it is preferred that the disconnecting step include operating a slide-latch on the cable connector to release the connector from the holder.

All of the foregoing operational principles and advantages of the present invention will be more fully appreciated upon consideration of the following detailed description, with reference to the appended drawings, of which:

BRIEF DESCRIPTION OF THE DRAWINGS

FIG. 2 is a like view from above left, and somewhat enlarged, but showing only the front and side of the rack with the electronics module completely inside, and one cable connector aligned to enter one cable-connector holder;

FIG. 4 is an enlarged isometric view of the rack, from above right, with the door open showing the engaging bars and one lever arm;

FIG. 6 is a two-step flow chart depicting a method of interconnecting numerous cable connectors with corresponding numerous panel connectors;

FIG. 7 is a two-step flow chart depicting a method of disconnecting numerous cable connectors from corresponding numerous panel connectors;

FIG. 8 is a two-step flow chart depicting a method of connecting an individual cable connector to a respective panel connector;

FIG. 8A includes the same two-step method above with additional information for the securing step;

FIG. 9 is a two-step flow chart depicting a method of disconnecting an individual cable connector to an individual panel connector;

FIG. 9A includes the same two-step method above with additional detail for the disconnecting step;

DETAILED DESCRIPTION OF THE PREFERRED EMBODIMENTS

Figure 1:
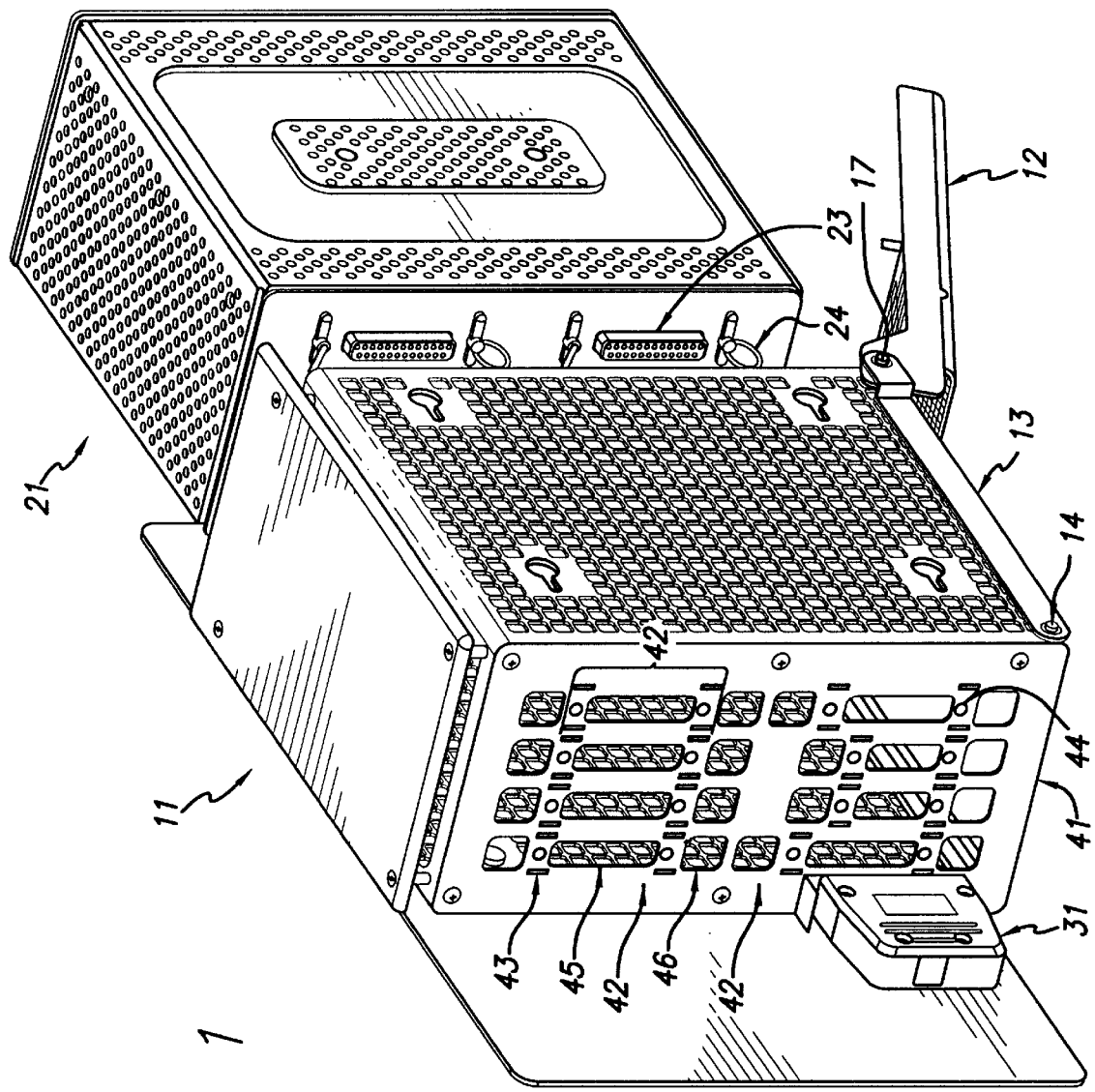
FIG. 1 is an isometric view from above right, showing the front of the rack—with the door open and the electronics module aligned to enter the back of the rack through the opening, and one cable connector aligned to enter one cable-connector holder.
Figure 1A:
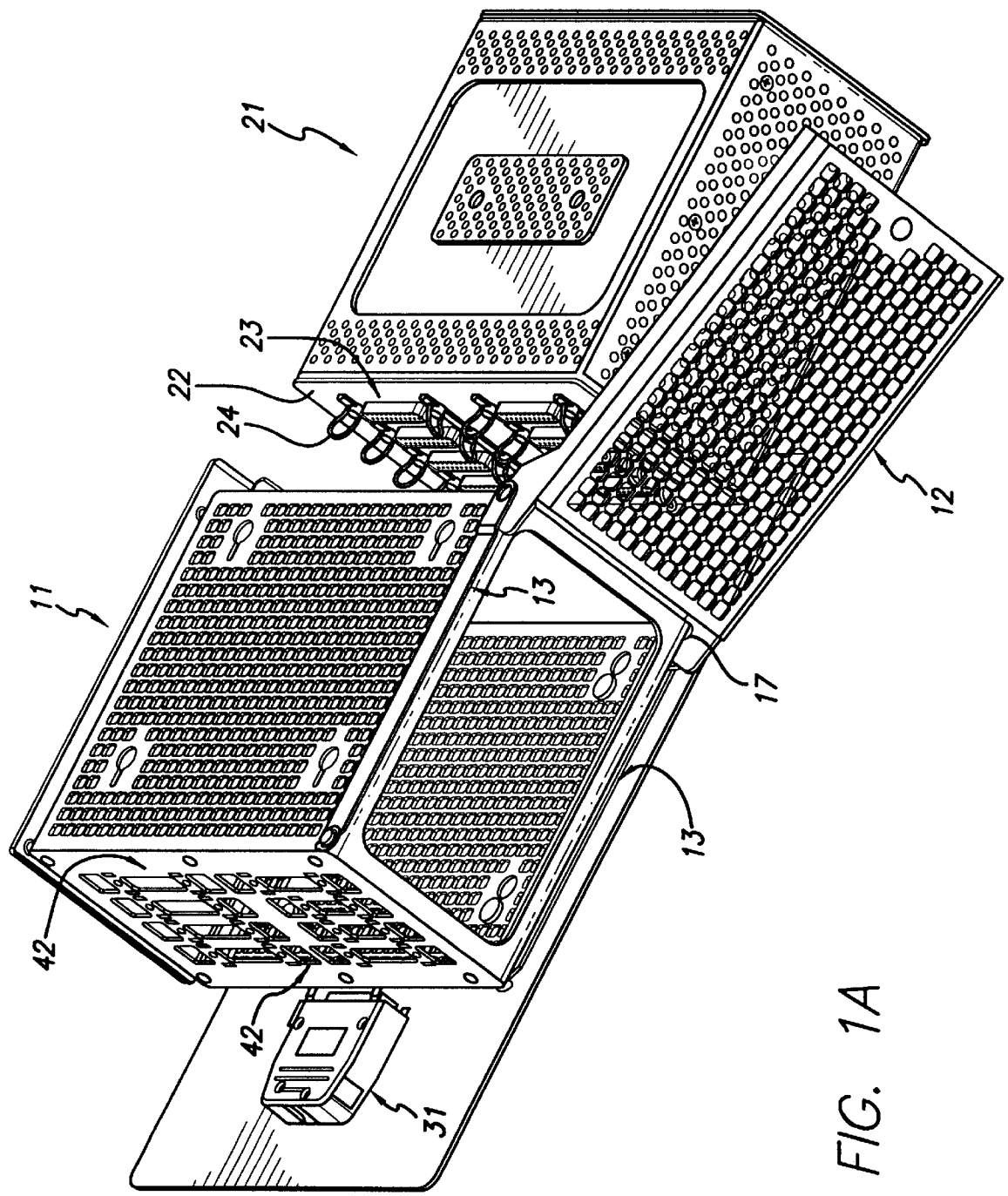
FIG. 1A is a like view from below right.

A preferred embodiment of my invention provides a rack 11 which acts as a housing for an electronics module 21 (FIGS. 1 and 1A). The rack creates a mechanical intermediary between the electronics module and numerous cable connectors.

This intermediary is different from the intermediary created by the prior rack design. That prior rack design created a mechanical and electrical intermediary. This preferred embodiment of my invention creates an exclusively mechanical intermediary, with a panel 41.

The front side of the rack carries the panel 41 with an array of cable-connector holders 42 (FIGS. 1 and 1A). The benefit of this structure is that it allows the electronics module to be disconnected from the cable connectors without disconnecting any cable connectors individually—but each cable connector can be quickly removed individually for troubleshooting access or the like as explained earlier.

Each cable-connector holder includes a connector aperture 45, defined in the panel, through which a cable connector 31 can engage a panel connector 23. Each cable-connector holder 42 also includes four slots 43 which are defined at the corners of the connector aperture 45 (FIG. 1).

These simple slots serve admirably as the previously introduced connector engaging or disengaging means, and are the form which I prefer. As mentioned earlier, however, various partial equivalents are available—for example notches or like cutouts that are not completely surrounded by material of the panel, or formed or attached hook structures that project outward to engage slots or other features formed in the cable connectors.

Also included are two circular apertures 44: one at each side of the connector aperture 45 respectively. Further included beyond the slot and circular aperture, at each side of the connector aperture, is an opening 46 for passage of a latch 24 on the electronics module 21. These square openings and latches are provided to give the invention backward compatibility with conventional cable connectors known heretofore; in preferred practice of my invention they are generally unused.

The electronics module 21 enters the rack through an orifice created when a door 12 is open. The front side of the electronics module is a panel 22 with an array of panel connectors 23 (FIGS. 1 and 1A). The latches 24 are located at opposite ends of each panel connector. Again these latches will only appear on the current electronics modules to provide the invention backward compatibility.

The door 12 hinges at the bottom of the rack 11 at hinge pivot points. Attached to the door, by pivot points near the hinge, 17 very 16 as shown are two arms or linkages 13 (FIGS. 1 and 1A). Opening the door operates the two arms or linkages, which are positioned parallel to each other along the bottom of each side of the rack, and extend almost to the inside of the front panel 41 of the rack.

The arms pull back a rod 14 (FIGS. 5 and 5A) when the door is opened. The rod is attached to the ends of the arms and is perpendicular to those arms. The door is thus a lever, with a very high mechanical advantage by virtue of the illustrated close spacing (relative to the length of the door) between the linkage pivots 17 and hinge pivots 16, for pulling the links 13 toward the open end of the rack 11.

Figure 2A:
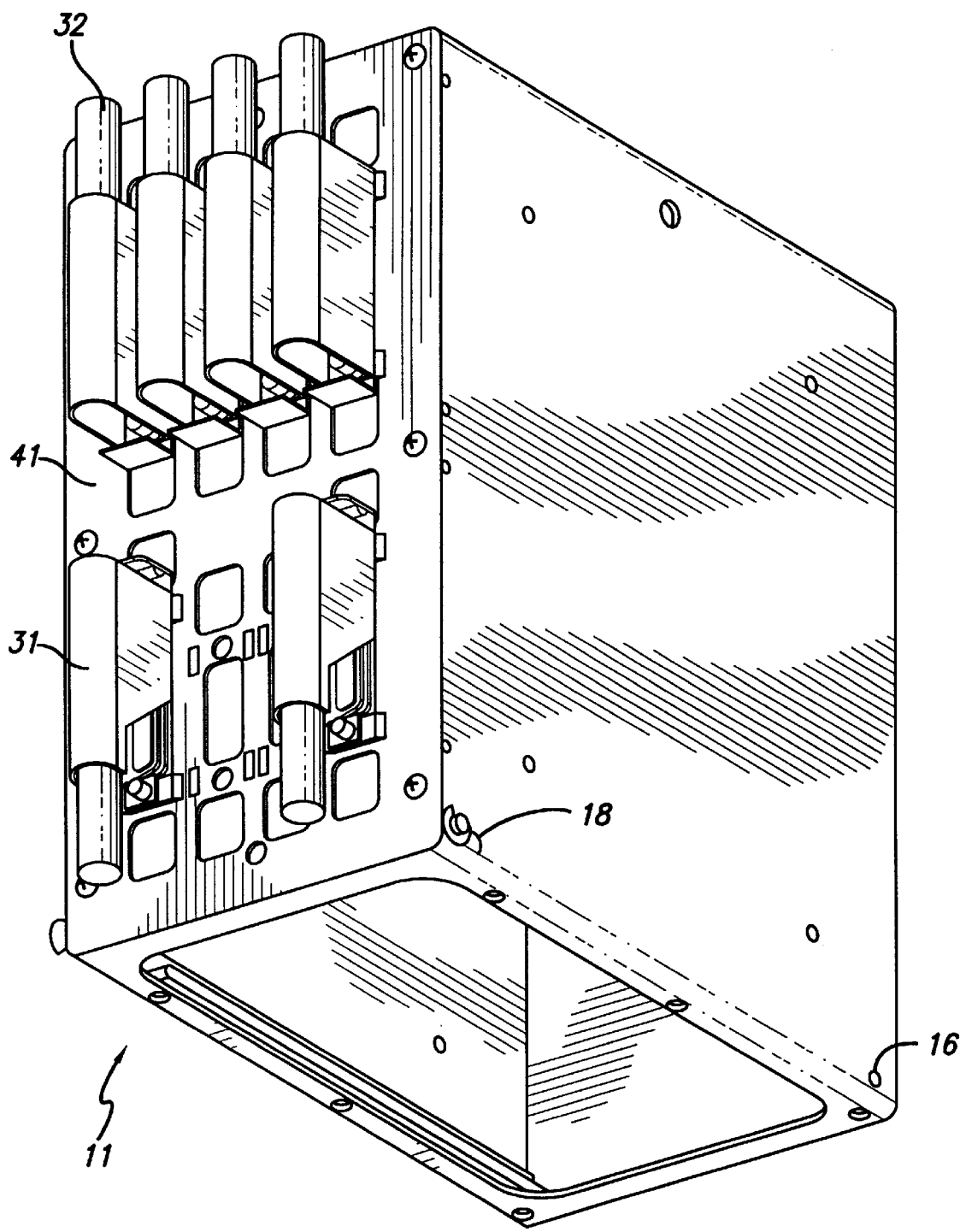
FIG. 2A is an isometric view of the rack from below right front, showing numerous cable connectors attached.
Figure 5:
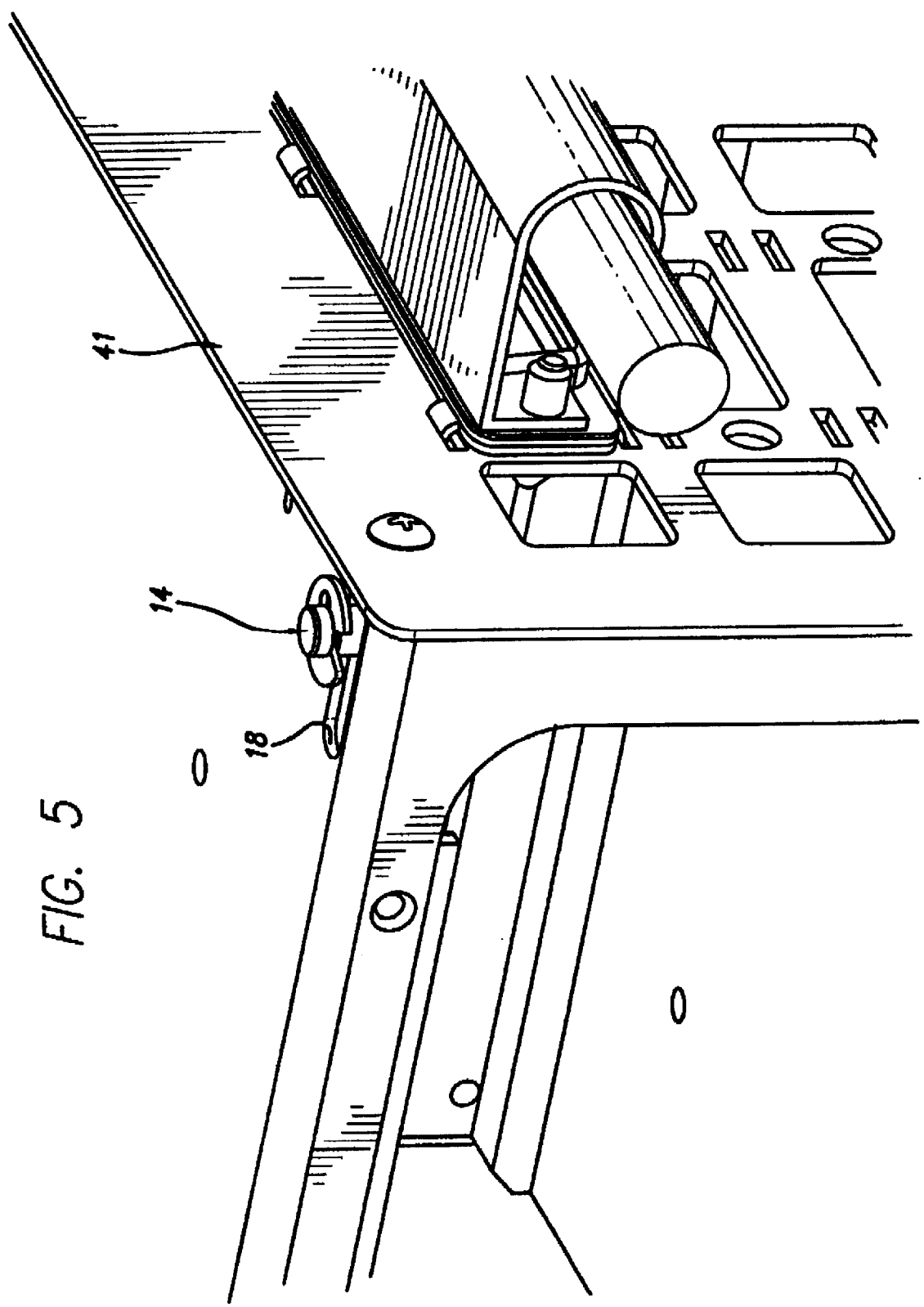
FIG. 5 is a like view of the rack, from below left, showing the rod without the lever arm attached.
Figure 5A:
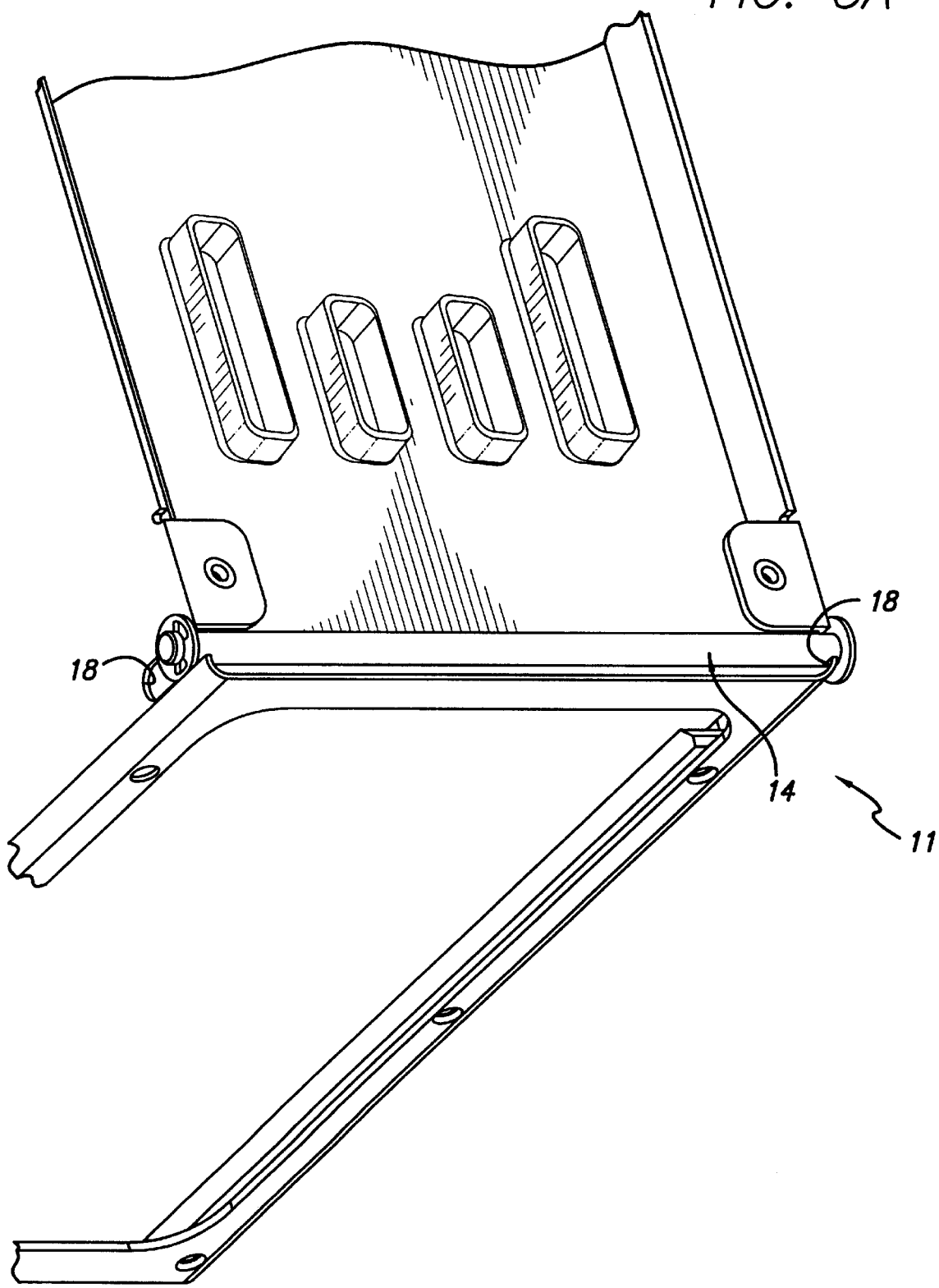
FIG. 5A is a like view, less highly enlarged and with the front panel removed (but with some connectors still included for orientation) to show the rod in place.
Figure 10:
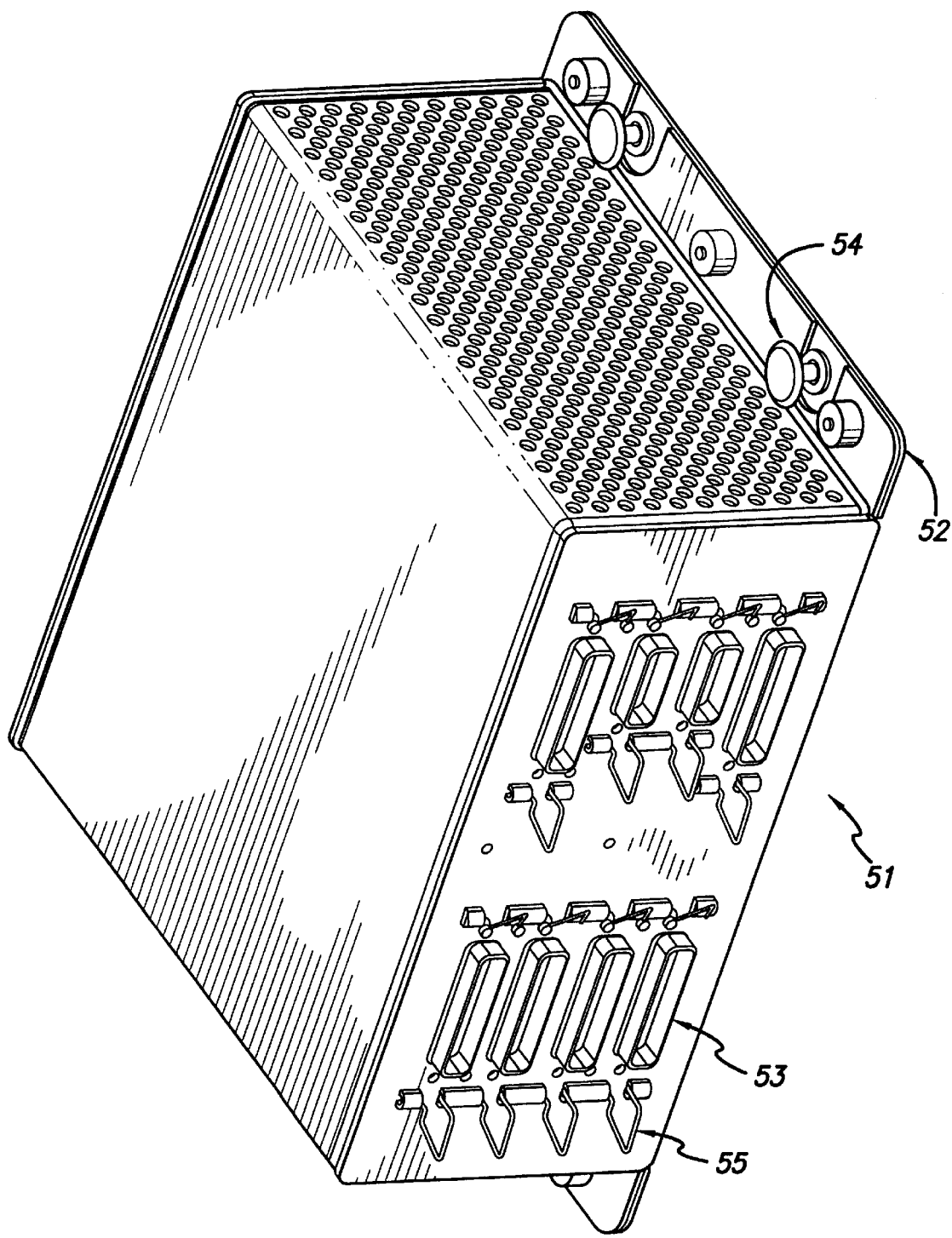
FIG. 10 is an isometric view from above of the left side of the prior nonrack design, without cable connectors.
Figure 11:
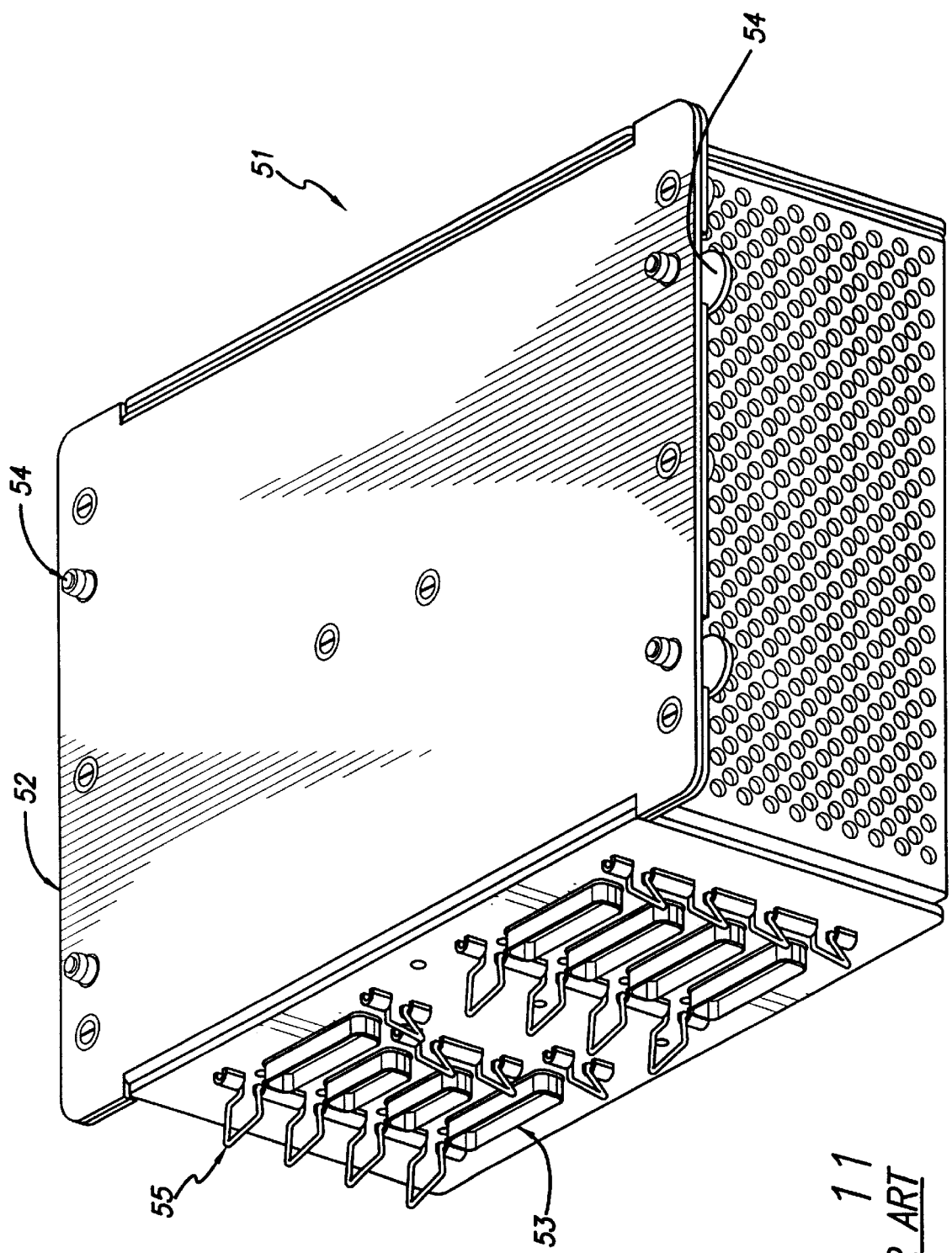
FIG. 11 is a like view but from below right.
Figure 12:
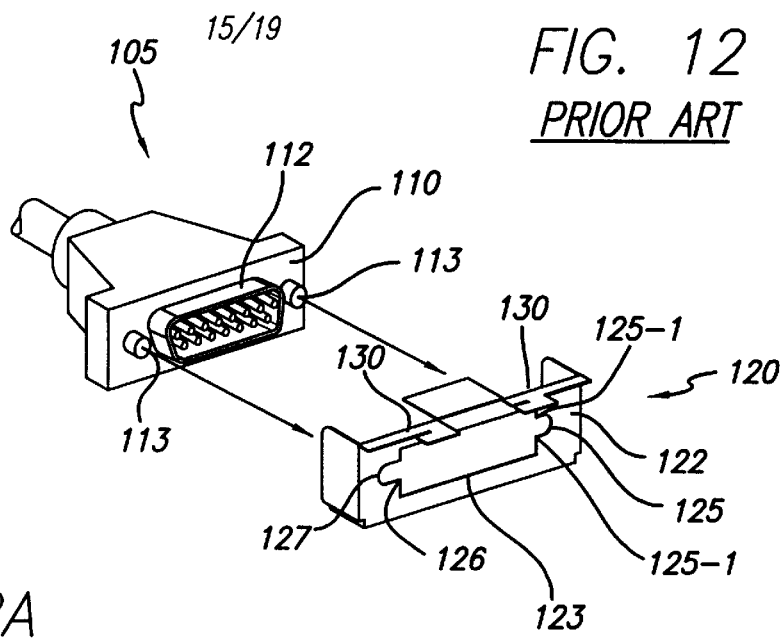
FIG. 12 is an isometric view of the prior-art cable connector aligned with the removable locking device.
Figure 12A:
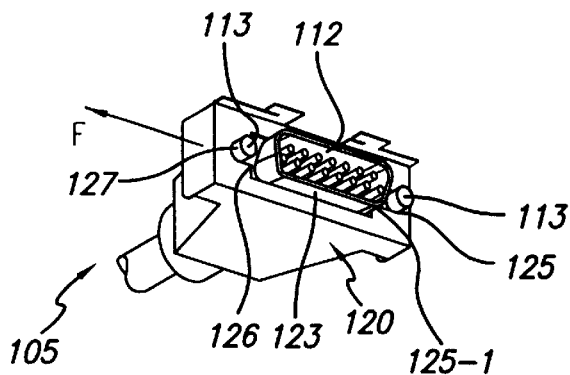
FIG. 12A is a like view with the cable connector attached to the locking device.
Figure 12B:
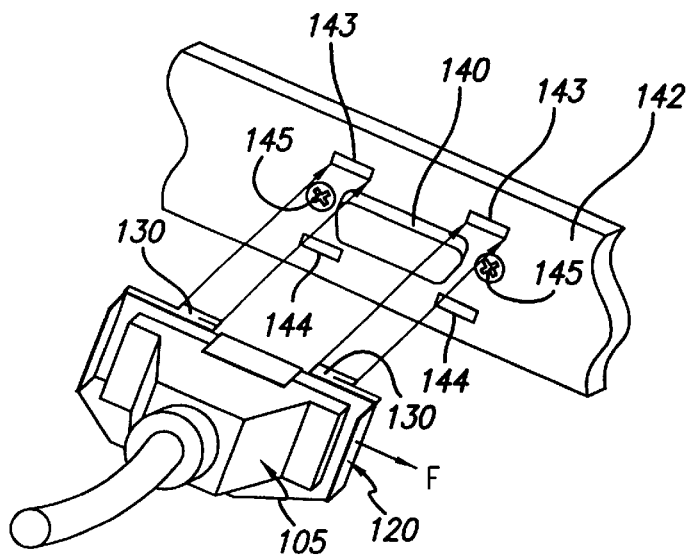
FIG. 12B is an isometric view of the cable connector with locking device attached, aligned to enter the panel.
Figure 13:
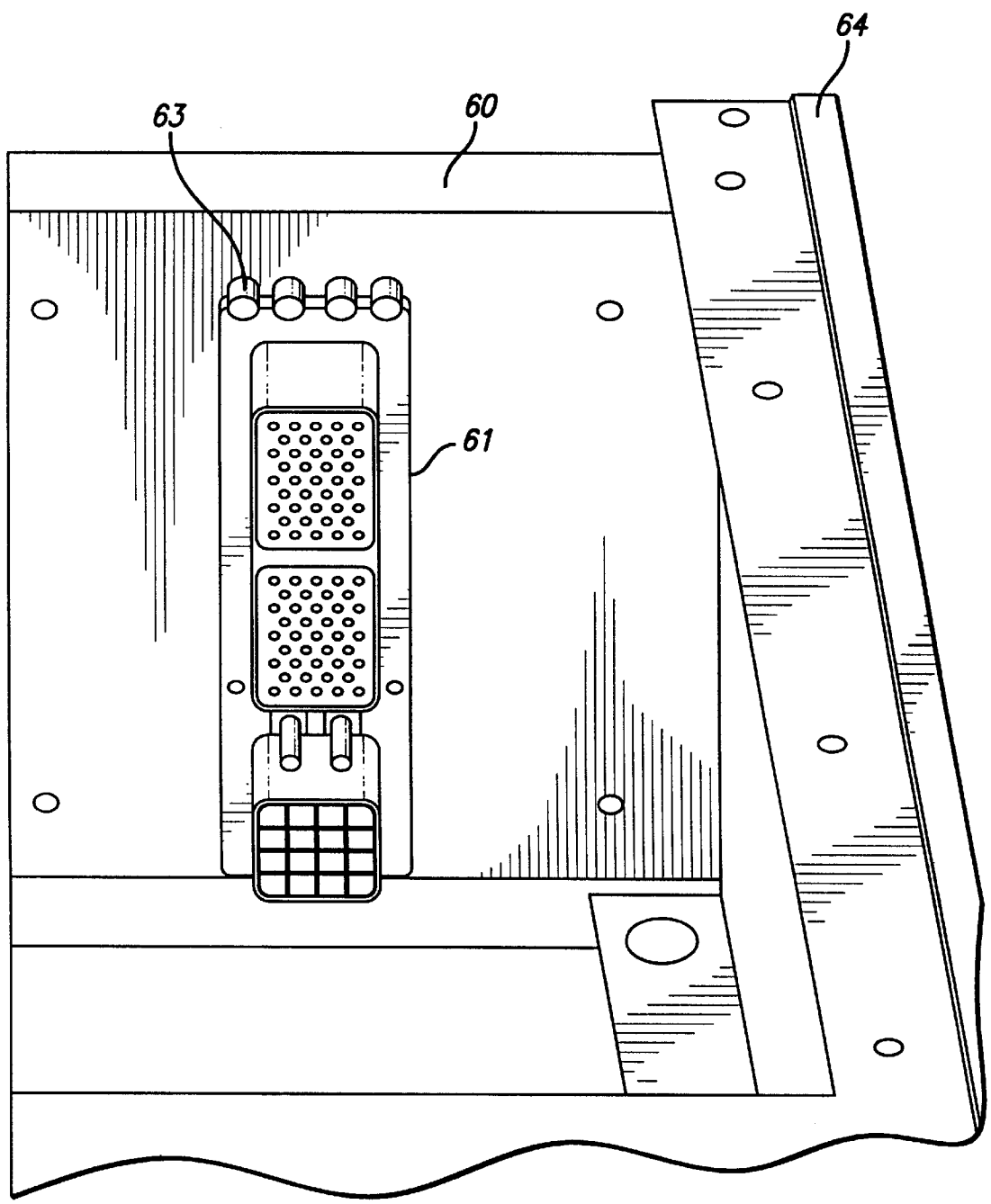
FIG. 13 is a perspective view of the rack interior from above rear, showing the unitary connector.
Figure 13A:
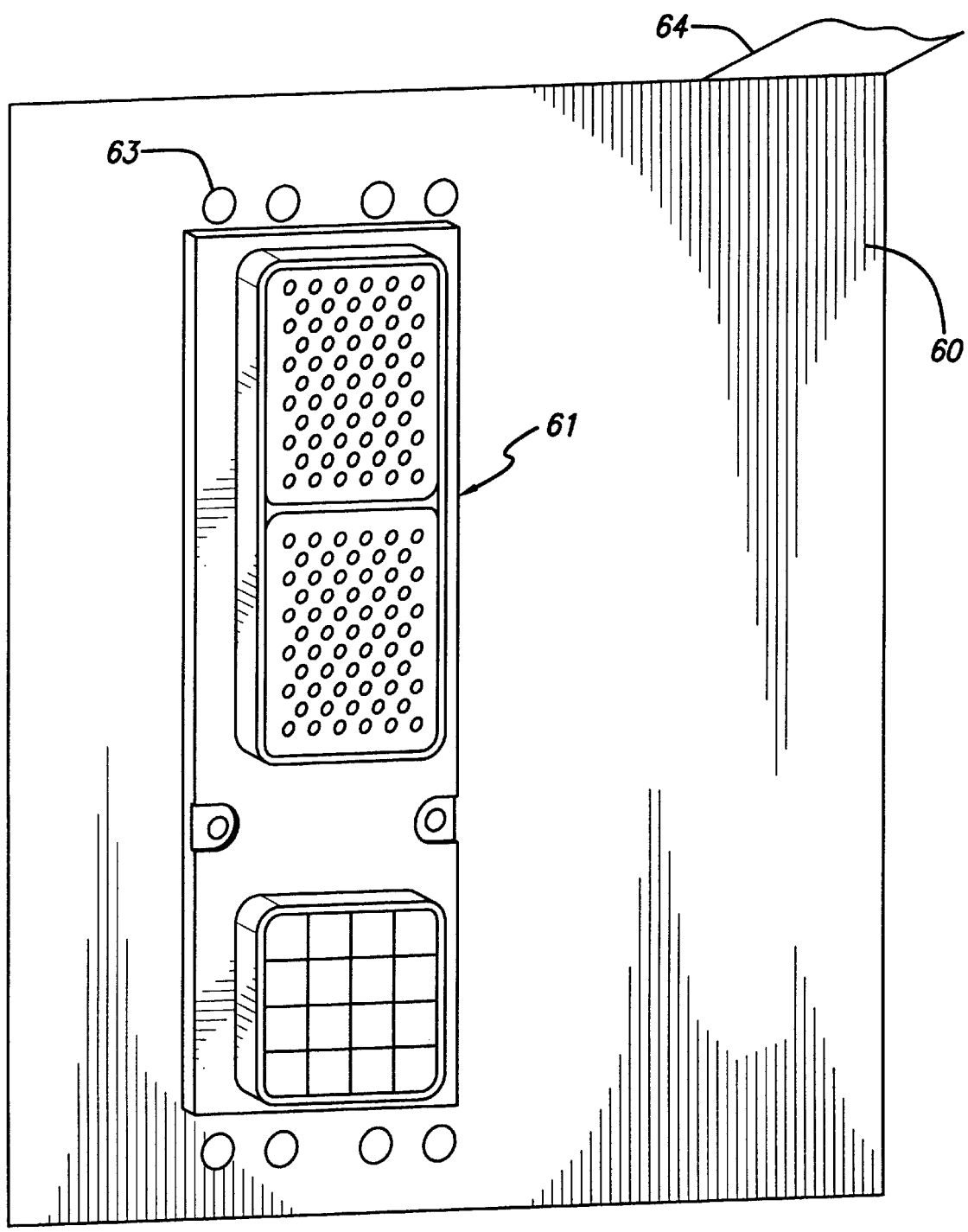
FIG. 13A is a like view, but enlarged and from within the rack.
Figure 13B:
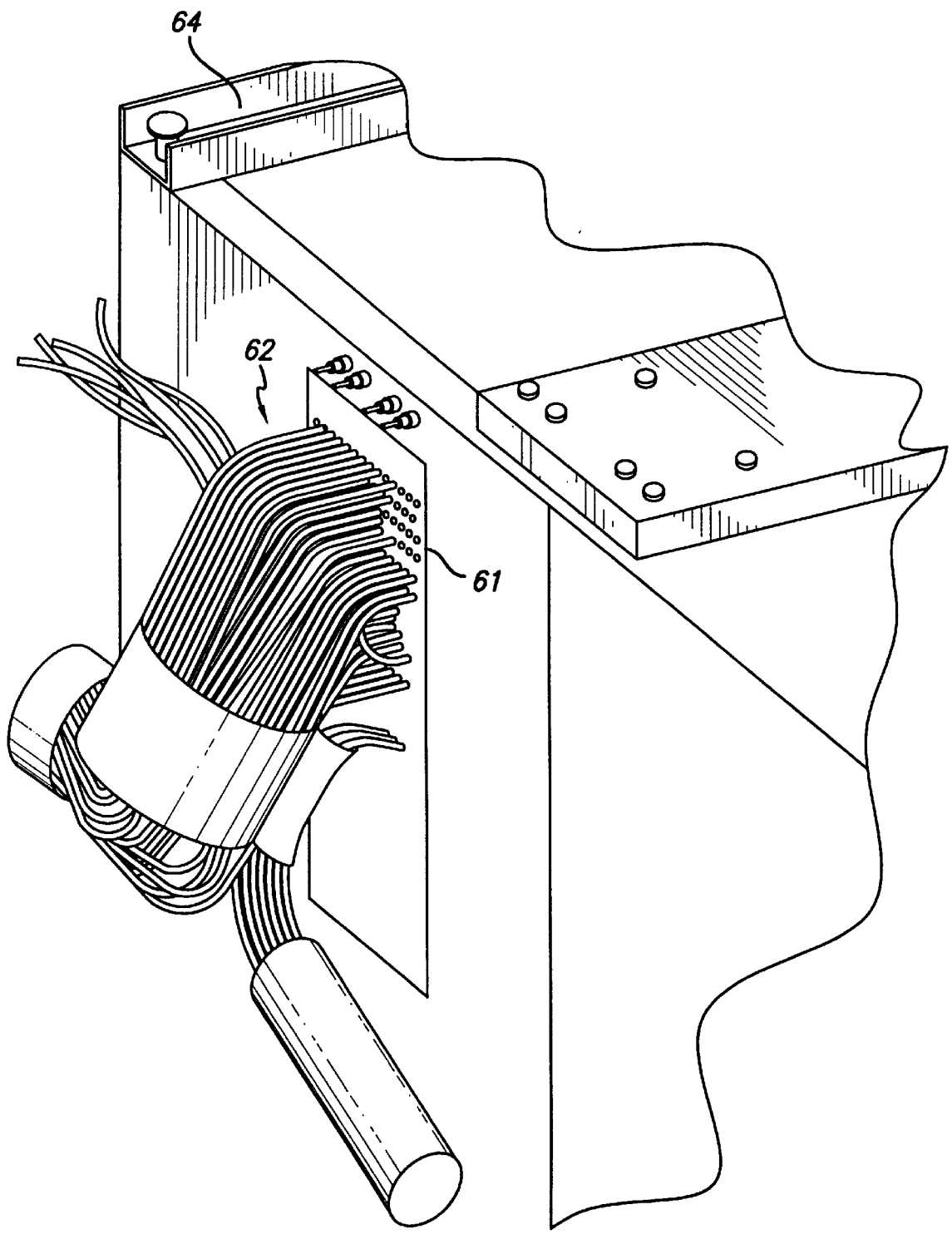
FIG. 13B is an exterior view of the unitary connector from above right front, showing the cables attached.
Figure 13C:
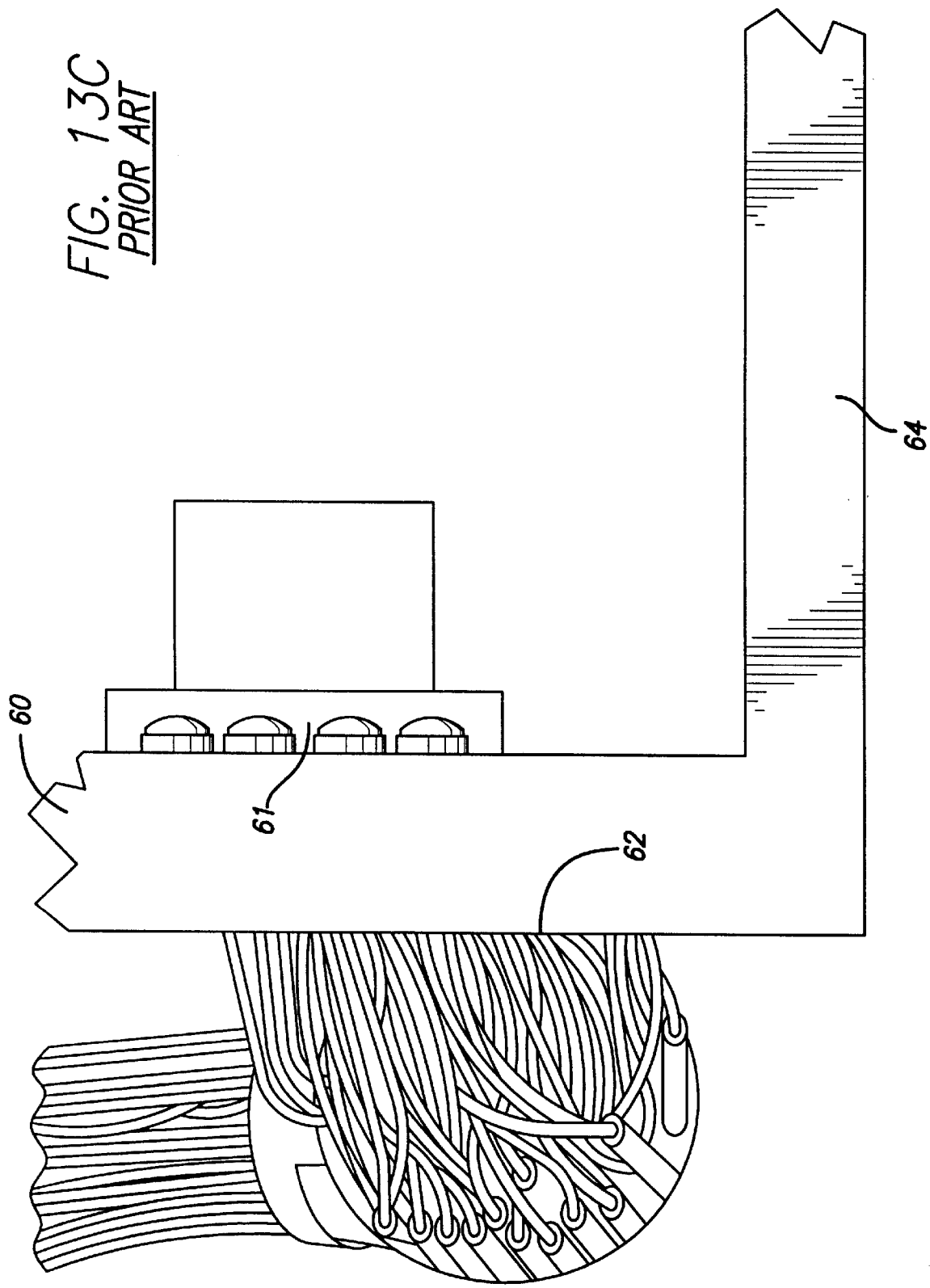
FIG. 13C is a perspective view, from above right and enlarged, showing the unitary connector mounted in the rack.

The links 13 in turn pull on the cross-rod 14. The ends of the rod also fit in a notch or open slot 18 (FIGS. 4 and 5A). The rod ends are captured in this slot 18 when the end of the slot 18 is covered by the rear panel 41 (FIGS. 2A and 5).

The cross-rod 14 is thereby operated aft toward the door 12 when the door is opened. It thereby pulls strongly outward on the relatively heavy electronics module 21 to nudge its connectors out of engagement with those secured to the back of the rack 11. Therefore the rod pulls the electronics module 21 out of the rack when the door is open. The one-step process of opening the door completes two objectives. First the electronics module is unsecured; second, the rod pulls the module out of the rack.

This structure of lever and linkage is a particularly simple and effective form of means for disengaging the electronics module from the rack, and withdrawing all the connector pins—simultaneously—because it operates, in a sense, automatically in response to opening of the door.

The door 12, when it is being closed, now again acts as a lever, but here with relatively lower mechanical advantage by virtue of the relatively sizable distances from the hinge 16 to the bars 15. Thus the leverage of the door is now applied with moderate mechanical advantage in pushing, forward, on the bottom one of the two bars 15.

The door leverage also operates with very low mechanical advantage for pushing on the upper one of the bars 15. Both bars act to help shove the electronics module slidingly the last fraction of an inch into place, and thereby help reengage the connectors. As will now be very evident, the user's weight can be more readily applied, by leaning into the work, in pushing the door shut than in starting the door open; hence the lower mechanical advantages here are adequate. To an extent, however, many other kinds of mechanisms are equivalents within the scope of the appended claims.

One example is a separately actuated lever and cam arrangement, for instance not triggered by operating the door but by a separate handle, pedal, draw-cord with pulleys or block and tackle, etc. The essences of the particular feature are that a mechanical advantage is provided to help withdraw the module, and operation is from the back of the rack where the module will exit—so that the entire operation can be accomplished from the same end of the rack. Thus any mechanism that generally supplies these characteristics could possibly serve.

When the electronics module 21 (FIG. 2) is completely inside the rack 11, each of the panel connectors 23 aligns with its corresponding cable-connector holder 42. The panel connectors are positioned such that they are approximately flush with the front panel 41 of the rack. The latches 24 pass through the openings 46 so that they can engage cable connectors if the cable connectors require them.

A cable connector 31 is shown properly aligned for connection to the rack 11 and the panel connector 23. Numerous cable connectors (FIG. 2A) can be attached to the rack, enabling the electronics module to operate (or otherwise interact with) several pieces of equipment.

A cable connector 31 (FIGS. 3 through 3B) has several features which allow it to quickly and securely engage the cable-connector holder 42 on the front panel 41 of the rack 11. The features include a tapered screw 34, a protective shell 35 that encases the pins, and four hooks 33. The tapered screws (and to a much lesser extent the shell), in entering respective apertures in the panel, guide and properly align the cable connector with respect to the cableholder portion of the panel.

Figure 2B:
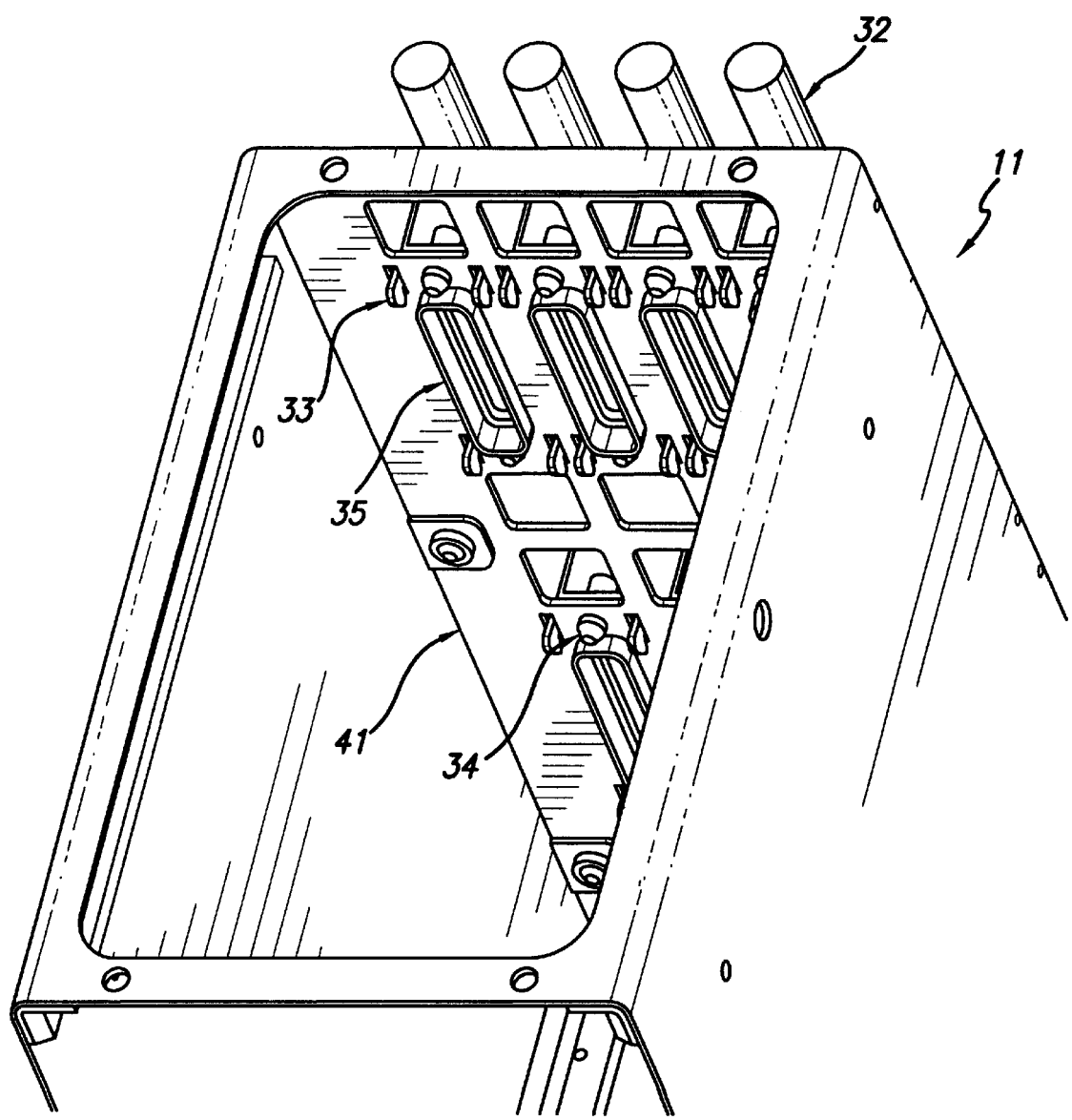
FIG. 2B is a like view from above left rear, showing the interior surface of the panel in the rack.

The tapered screws 34 enter the circular apertures 44 (FIGS. 2A and 2B). The cable-connector shell enters the connector aperture 45.

The conically tapered screw and its mating aperture in cooperation tend to center the connector properly in the aperture—and guide it very precisely into place for mating with the corresponding electronics-module panel connector. They thereby function as the guiding means mentioned in an earlier section of this document.

Equivalent guiding means, however, may include an aperture that is not circular or not wholly enclosed—with a matching screw profile—or may include a tapered projection from the panel, perhaps in cooperation with an aperture in the corresponding cable connector. Further, although I prefer to use a conically symmetrical taper, various other taper configurations (oval, triangular, etc.) could be adequate and equivalent, as could be two screws or pins each tapered on one respective side only (or angled in one respective direction only), so that the two elements do together, in conjunction, what perhaps neither one could do separately.

The four hooks 33 on the cable connector 31 can directly enter their corresponding slots 43 of the cable-connector holder 42. These hooks serve very well as the previously discussed connector-holder engaging or disengaging means, but various partial equivalents are believed to be within the scope of the appended claims. As suggested in connection with the cable-connector engaging or disengaging means, for example, features of these two means may be exchanged —so that slots are formed in the cable connector to engage hooks or other projections from the panel.

Figure 3:
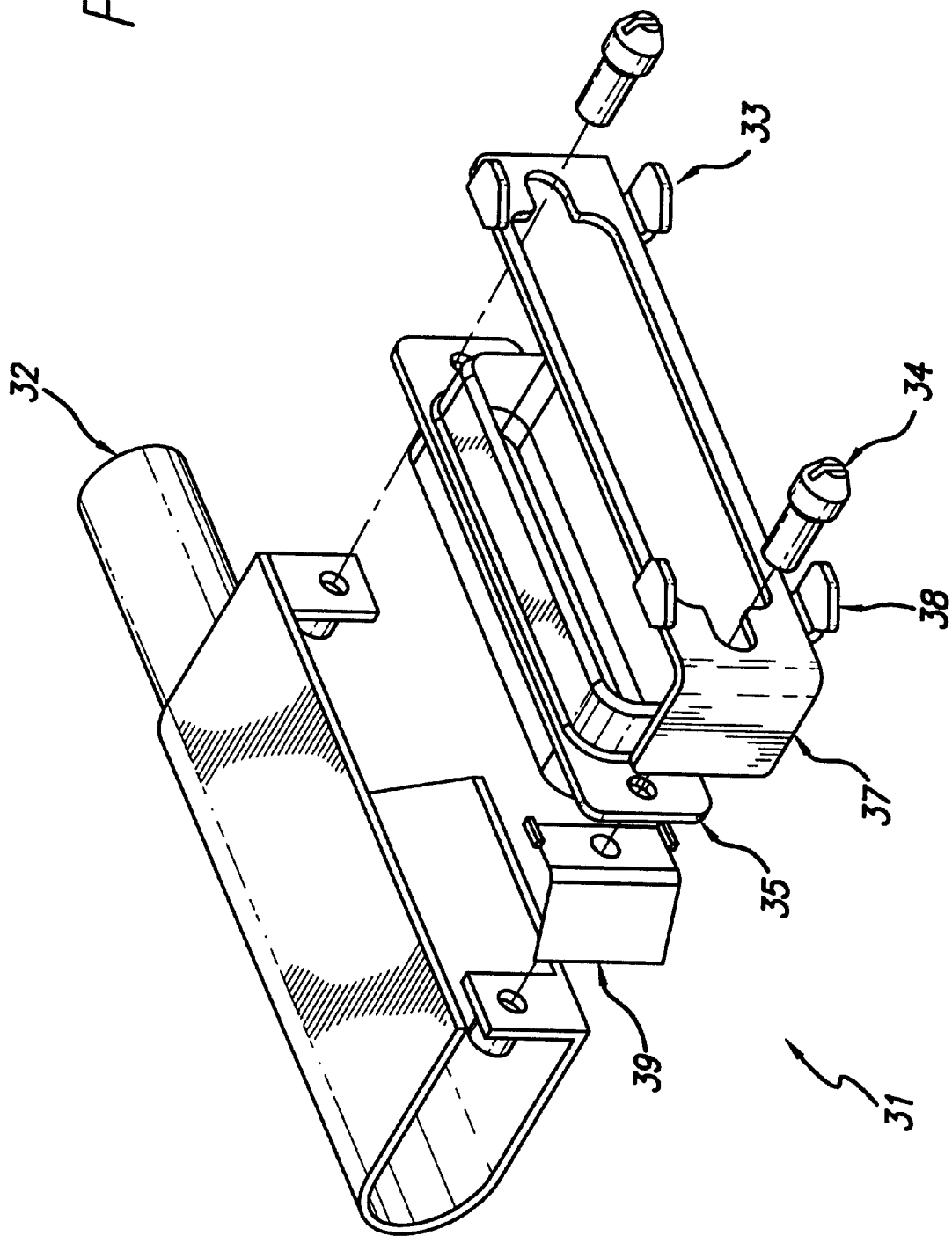
FIG. 3 is an exploded isometric view of the right side of a cable connector.
Figure 3B:
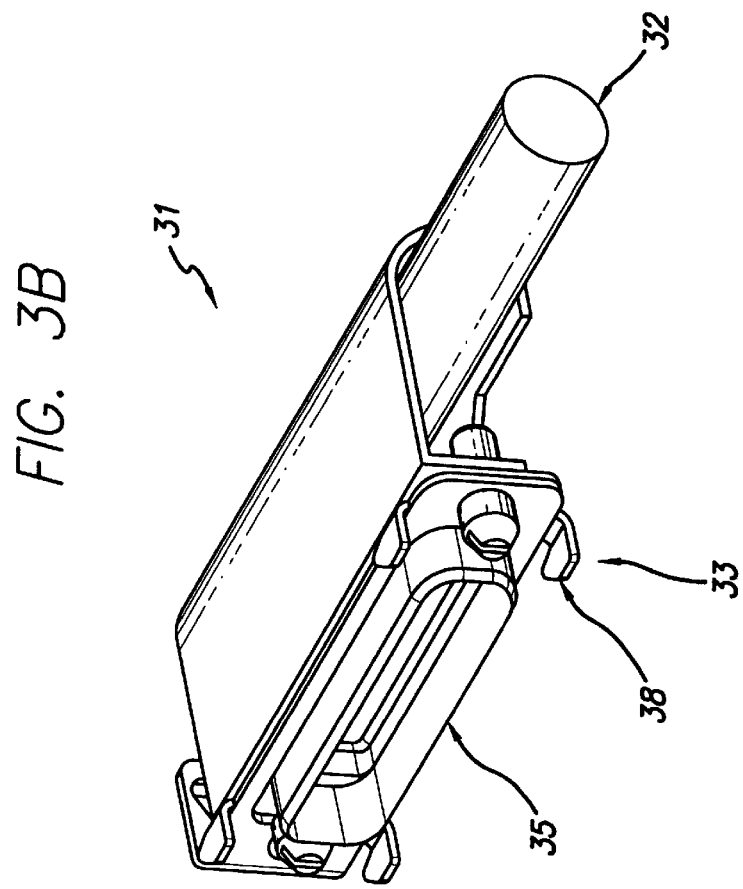
FIG. 3B is an isometric view of the cable connector assembled and with a cable attached.
Figure 3A:
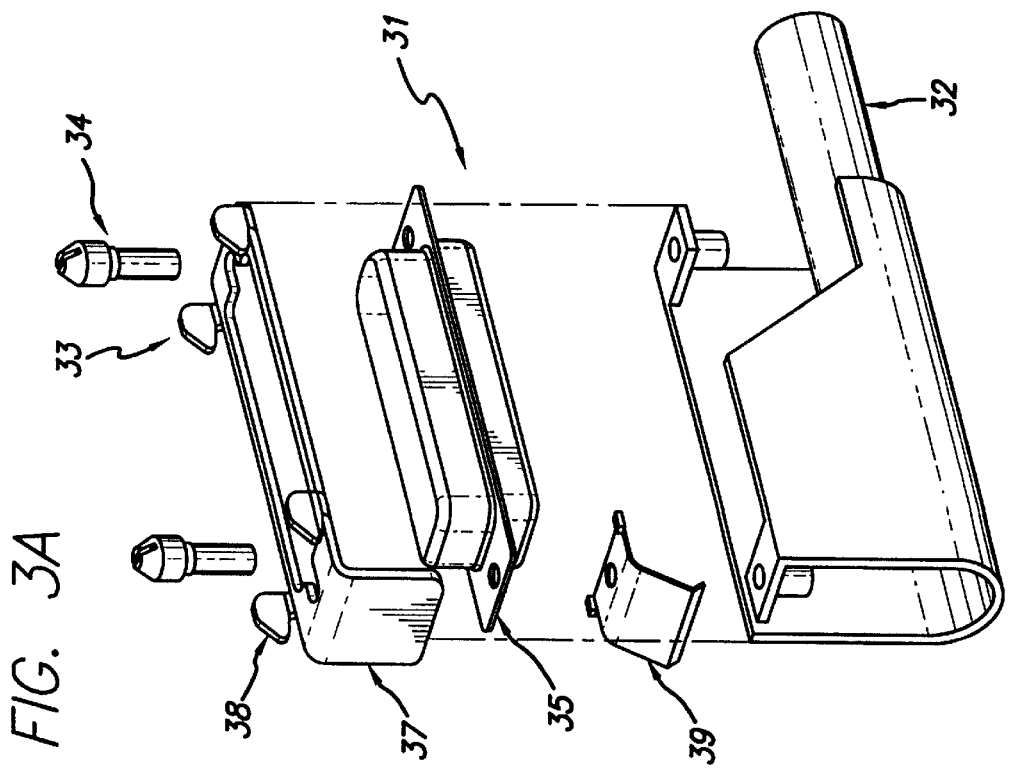
FIG. 3A is an exploded isometric view of the same side.

The cable connector 31 has a self-locking mechanism, which includes a latch 37 that is loaded by a spring 39 (FIGS. 3 and 3A). Also included is a cam 38 which works when the cable connector is pushed into the cable-connector holder. The cam engages the holder to temporarily move the latch out of a locked position. To disengage the cable connector from the cable-connector holder, a person manually compresses the latch 37 out of the locked position and pulls the cable connector out.

The combination of the above structures results in an enormous increase in efficiency. The cable connector can be attached easily and quickly with one hand.

The cable connector 31 includes a multiplicity of connector pins 40 (not shown), which may be substantially conventional pins, or pins of novel types not currently known. The pins are mounted in the connector body 31 and protected by a shell 35. A cable 32 enters the cable con. nector at an opening 36 on a side of the cable connector such that the cable exits its connector at a ninety-degree angle to the pins.

The rack 11 (FIG. 4) includes a means for engaging the panel connectors to their corresponding cable connectors. The engaging means includes two bars 15 on the door 12. These bars push on the back of the electronics module and in doing so seat all of the cable connections simultaneously.

This configuration allows the electronics module to be secured in the rack and have all of the cable connections engaged in one step. While this arrangement is particularly favorable as means for engaging all the connector pins fully—since it is actuated in a sense automatically with operation of the door—other devices may be equivalents for the purposes of the appended claims.

Such devices, as in the above-described case of the electronics-module extracting mechanism, may include similarly coactuated—or separately actuated—levers, pushrods, cams, cords with mechanical-advantage paths, etc.

In view of the foregoing description of the apparatus of my invention, the methods described in FIGS. 6 through 8 should be self explanatory.

The above disclosure is intended as merely exemplary, and not to limit the scope of the invention—which is to be determined by reference to the appended claims.

What is claimed is:

1. An apparatus for making or breaking electrical connections between numerous individual electrical cable connectors and an electronics module that has numerous individual corresponding panel connectors in an array; said apparatus comprising:

a rack for receiving and holding such electronics module; and an array of numerous individual cable-connector holders, formed in the rack, for receiving and holding such numerous individual cable connectors in positions aligned with such numerous individual panel connectors when such electronics module is held in the rack;

each cable-connector holder comprising means for easily and quickly engaging, or disengaging from, a corresponding cable connector, wherein:

the rack has means for quickly and easily engaging such electronics module with the rack, and seating all such cable connectors to such corresponding panel connectors, substantially simultaneously; and the module-with-rack engaging means comprise:

a door, hinged to the rack, for securing such electronics module, and at least one bar, inside the door, for pushing the electronics module into the rack as the door is closed.

2. Apparatus for making or breaking electrical connections between at least one electrical cable and an electronics module that has at least one panel connector; said apparatus comprising:

a rack for receiving and holding such electronics module;

at least one cable connector terminating the at least one cable, respectively; and at least one cable-connector holder, formed in the rack, for receiving and holding the at least one cable connector in position aligned with such at least one panel connector when such electronics module is held in the rack;

each cable connector comprising means for easily and quickly engaging, or disengaging from, a corresponding cable-connector holder; and each cable connector comprising pins for mating directly with such corresponding panel connector of the electronics module; wherein:

the engaging or disengaging means for each cable connector comprise a respective slide-lock retainer that tends to prevent vibration-induced disconnection of the individual cable connector from its connector holder;

the slide-lock retainer has a self-locking mechanism to automatically secure the retainer to the corresponding connector holder; and the self-locking mechanism comprises:

a spring-loaded latch, and a cam that engages the corresponding connector holder during making of a connection, to move the latch out of its locked position temporarily permitting connection of the individual cable connector to its holder.

3. A cable connector for positioning a cable at a connector holder; said connector comprising:

a multiplicity of connector pins mounted in a connector body;

means for connecting wires to the pins;

a shell for protecting the pins and connecting means;

a slide-lock retainer for engaging the connector holder to avoid vibration-induced spontaneous disconnection of the connector from its holder; and a self-locking mechanism to automatically secure the retainer to the corresponding connector holder; wherein the self-locking mechanism comprises:

a spring-loaded latch, and a cam that engages the corresponding connector holder during making of a connection, to move the latch out of its locked position temporarily permitting connection of the individual cable connector to its holder.

4. The apparatus of claim 3, further comprising:

a tapered element projecting from the cable connector toward a receptacle in the holder, to facilitate manual alignment of the connector with the holder.

5. A method of connecting an individual cable connector that has a slide-lock with a cam that engages a respective individual cable-connector holder to temporarily displace the slide-lock for attachment to the connector holder; said individual cable connector being one of numerous cable connectors attached to respective numerous individual panel connectors of an electronics module, using a rack that receives the module at one side of the rack and receives the cable connectors in respective individual cable-connector holders at another side of the rack; said method comprising the steps of:

plugging the individual cable connector into its respective individual panel connector of the electronics module; and securing the individual cable connector to its respective individual cable-connector holder; wherein, the securing step comprises advancing the connector generally straight into the holder, to operate the cam for temporary displacement of the slide-lock and enable engagement of the connector with the holder.

* * * * *